United States Patent
Gerber et al.

(10) Patent No.: US 7,582,963 B2
(45) Date of Patent: Sep. 1, 2009

(54) VERTICALLY INTEGRATED SYSTEM-IN-A-PACKAGE

(75) Inventors: Mark A. Gerber, Plano, TX (US); Wyatt Huddleston, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/092,363

(22) Filed: Mar. 29, 2005

(65) Prior Publication Data
US 2006/0220206 A1    Oct. 5, 2006

(51) Int. Cl.
*H01L 23/34* (2006.01)

(52) U.S. Cl. .............. 257/723; 257/666; 257/724; 257/E23.066; 438/107; 438/109

(58) Field of Classification Search ........... 257/232, 257/666, 687, 678, 723, 724, E23.066; 438/106, 438/107, 109
See application file for complete search history.

(56) References Cited

U.S. PATENT DOCUMENTS

| | | | | |
|---|---|---|---|---|
| 5,864,177 A | * | 1/1999 | Sundstrom | 257/723 |
| 5,998,864 A | * | 12/1999 | Khandros et al. | 257/723 |
| 6,215,182 B1 | * | 4/2001 | Ozawa et al. | 257/723 |
| 6,570,249 B1 | * | 5/2003 | Liao et al. | 257/724 |
| 6,621,155 B1 | * | 9/2003 | Perino et al. | 257/686 |
| 7,176,506 B2 | * | 2/2007 | Beroz et al. | 257/232 |
| 2003/0173680 A1 | * | 9/2003 | Liao et al. | 257/777 |
| 2004/0009628 A1 | * | 1/2004 | Peng | 438/107 |
| 2004/0061212 A1 | * | 4/2004 | Karnezos | 257/686 |
| 2005/0140022 A1 | * | 6/2005 | Tao et al. | 257/777 |
| 2005/0148113 A1 | * | 7/2005 | Karnezos | 438/109 |

OTHER PUBLICATIONS

Semiconductor definition for die and chip by semiconductorglossary.com.*

* cited by examiner

*Primary Examiner*—W. David Coleman
*Assistant Examiner*—Su C Kim
(74) *Attorney, Agent, or Firm*—Yingsheng Tung; Wade J. Brady, III; Frederick J. Telecky, Jr.

(57) ABSTRACT

According to one embodiment of the invention, a method of forming a system-in-a-package includes providing a first substrate, coupling a first die to a top surface of the first substrate, coupling one or more surface mount devices to a top surface of a second substrate, coupling the second substrate to a top surface of the first die, interconnecting the first substrate, the second substrate, and the first die, and encapsulating the first die, the second substrate and the surface mount devices.

5 Claims, 2 Drawing Sheets

VERTICALLY INTEGRATED SYSTEM-IN-A-PACKAGE

TECHNICAL FIELD OF THE INVENTION

This invention relates generally to the field of integrated circuit packaging and, more specifically, to a vertically integrated system-in-a-package (SIP).

BACKGROUND OF THE INVENTION

Electronic devices, such as cell phones and PDA's, typically include several individually packaged integrated circuits with different functions. To facilitate space savings and, hence, significant down-sizing of electronic gadgets, 3D packaging solutions may be utilized.

One 3D packaging technique is a "System-in-a-Package" (SIP) approach. SIP refers to a semiconductor device that incorporates multiple die that make up a complete electronic system into a single package. SIP sometimes employs die stacking, which mounts die on top of one another and interconnects them.

Another form of 3-D packaging is package-in-a-package stacking. Package-in-package stacking involves flipping and stacking a tested package onto a base package, with subsequent interconnection via wire bonding. A package-in-package requires the tested package to be fully encapsulated prior to assembly within the base package.

SUMMARY OF THE INVENTION

According to one embodiment of the invention, a method of forming a system-in-a-package includes providing a first substrate, coupling a first die to a top surface of the first substrate, coupling one or more surface mount devices to a top surface of a second substrate, coupling the second substrate to a top surface of the first die, interconnecting the first substrate, the second substrate, and the first die, and encapsulating the first die, the second substrate and the surface mount devices.

Some embodiments of the invention provide numerous technical advantages. Other embodiments may realize some, none, or all of these advantages. For example, with SIP technology, according to one embodiment of the invention, vendors are able to reduce the footprint of integrated circuit packages. In addition, embodiments of the invention may reduce development time to bring new products to the market. The integration of passive components may be performed independently of the standard packaging process, and may be pre-fabricated at a site other than that which assembles the package.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Figure 1:
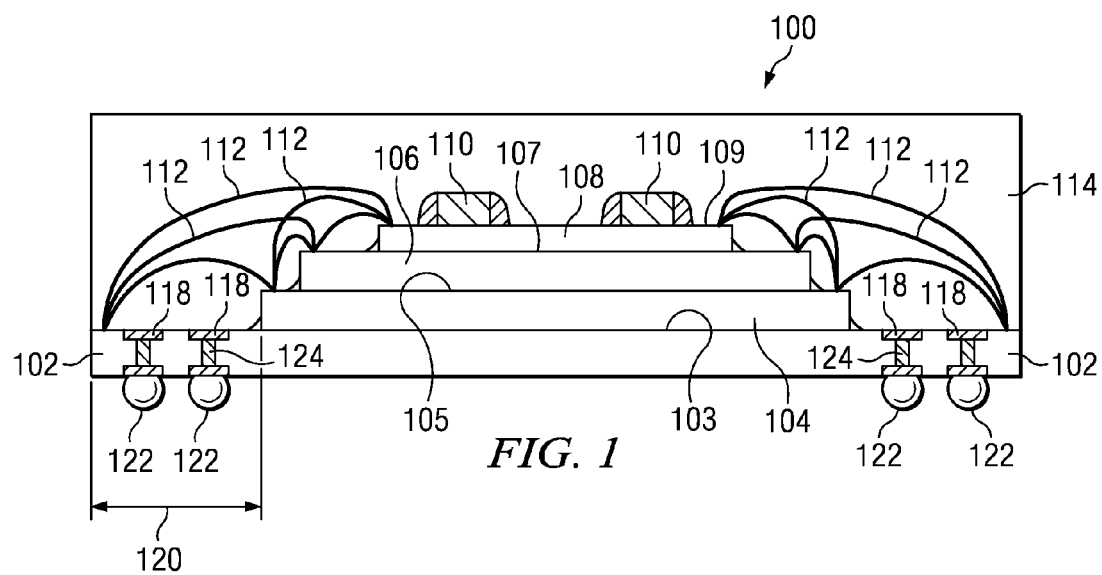
FIG. 1 is a perspective view of a system-in-a-package according to one embodiment of the invention.
Figure 2A:
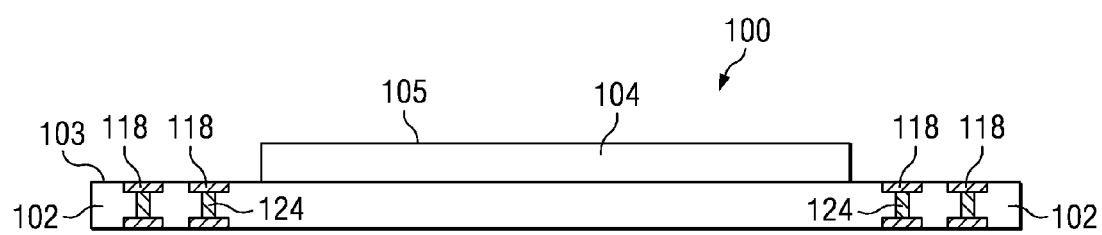
FIGS. 2A through 2E illustrate various manufacturing stages of the system-in-a-package of FIG. 1 according to one embodiment of the invention.
Figure 2B:
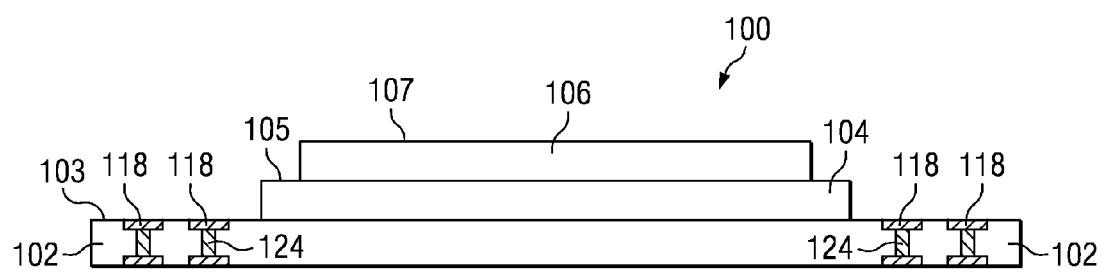
Figure 2C:
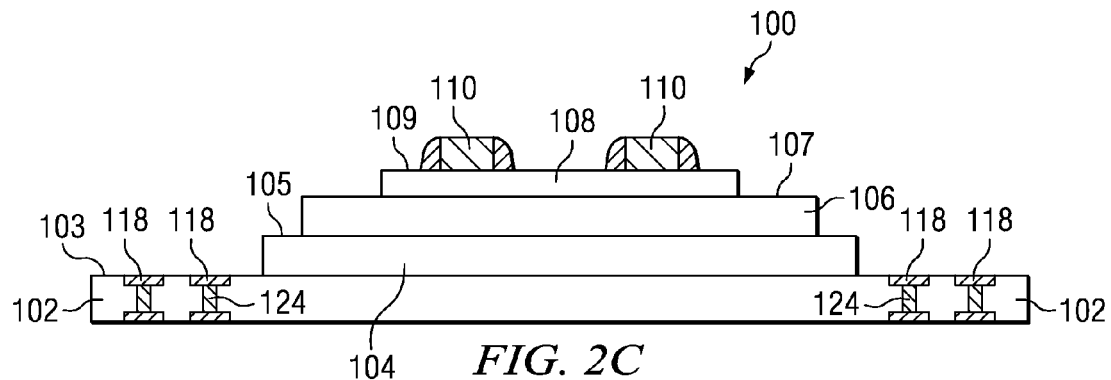
Figure 2D:
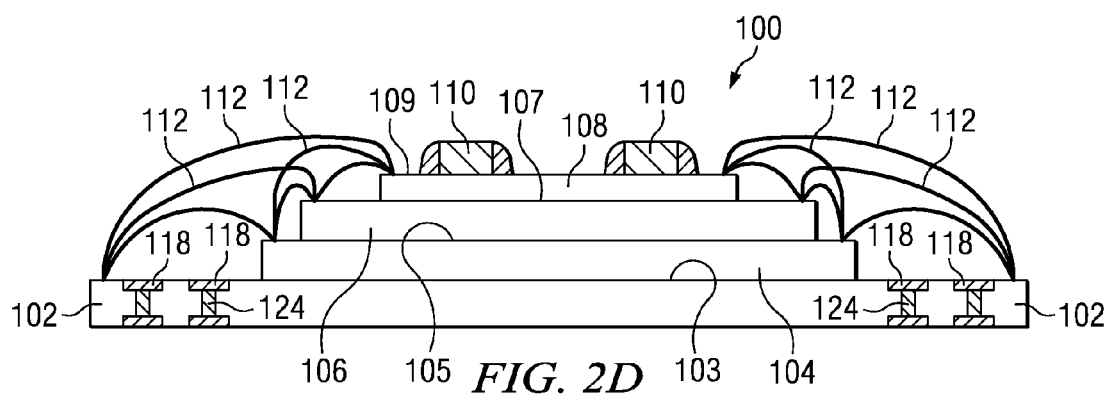
Figure 2E:
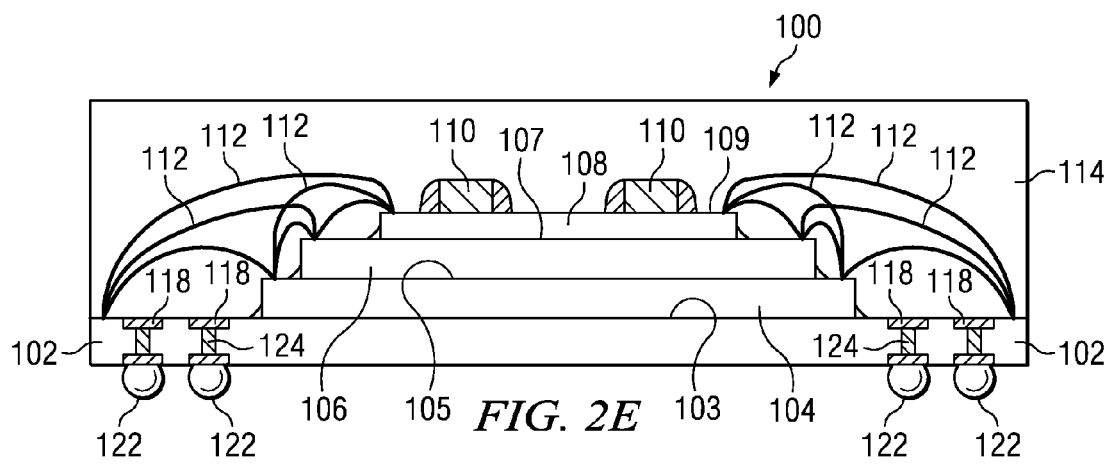

Example embodiments of the present invention and their advantages are best understood by referring now to FIGS. 1 through 2E of the drawings, in which like numerals refer to like parts.

FIG. 1 is a perspective view of a system-in-a-package ("SIP") according to one embodiment of the invention. In the illustrated embodiment, SIP 100 includes a first substrate 102, a first die 104, a second die 106, a second substrate 108, a plurality of surface mount devices 110, a plurality of wirebonds 112, a mold compound 114, a plurality of bond pads 118, and a plurality of solder balls 122. The present invention, however, contemplates more, fewer, or different components for SIP 100 than those shown in FIG. 1. One important advantage of some embodiments of the invention is that SIP 100 may provide passive component integration with a reduced footprint, which is described in further detail below.

Substrate 102, in one embodiment, is a glass-fiber-reinforced epoxy resin, such as FR4; however, substrate 102 may be formed from other suitable substrates, such as a laminate substrate, a ceramic substrate, and a polyimide substrate. Substrate 102 may also have any suitable shape and any suitable thickness. In the illustrated embodiment, substrate 102 includes a plurality of bond pads 118 formed on a top surface 103 thereof coupled to a plurality of solder balls 122 coupled to a bottom surface of substrate 102 by respective vias 124. Bond pads 118, vias 124, and solder balls 122 may be formed from any suitable material and may be arranged in any suitable manner.

First die 104 and second die 106 may be any suitable integrated circuit die having any suitable function. For example, both first die 104 and second die 106 may be formed from silicon or germanium with any suitable number and arrangement of dielectric and metal layers formed therein. First die 104 and second die 106 may also have any suitable contact pads (not explicitly illustrated) to facilitate interconnection between the various components of SIP 100. Although only two integrated circuit die 104, 106 are illustrated in FIG. 1, the present invention contemplates any suitable number of integrated circuit die being stacked on top surface 103 of substrate 102. First die 104 may couple to substrate 102 in any suitable manner, such as by a suitable epoxy. Second die 106 may couple to a top surface 105 of first die 104 via any suitable manner, such as with a film adhesive.

Substrate 108, in one embodiment, is a passive electrical carrier having surface mount devices 110 coupled to a top surface 109 thereof. Substrate 108 may be formed from any suitable substrate, such as a tape substrate, a laminate substrate, a ceramic substrate, or other suitable substrates. Substrate 108 may be coupled to a top surface 107 of second die 106 in any suitable manner, such as with a film adhesive. In a particular embodiment of the invention, substrate 108 has a plurality of solder balls (not illustrated) coupled to a bottom surface thereof that couple to top surface 107 of second die 106. In this embodiment, any suitable reflow technology may be utilized to couple substrate 108 to second die 106. Furthermore, in this particular embodiment, second die 106 may have suitable metallization formed therein that is similar to bonding over active circuitry ("BOAC").

Surface mount devices 110 may be any suitable passive or active discrete components. In one embodiment, surface mount devices 110 include suitable passive components, such as capacitors, diodes, resistors, and inductors. Surface mount devices 110 may couple to a top surface 109 of substrate 108 in any suitable manner, such as soldering. According to the teachings of one embodiment of the invention, surface mount devices 110 are coupled to top surface 109 of substrate 108 instead of being coupled to a perimeter 120 of top surface 103 of substrate 102, as is done with some prior SIP's. This not only reduces the footprint of SIP 100, but enhances the manufacturability and reliability of SIP 100. For example, the passive integration process for surface mount devices 110 may be performed independently from the standard packaging processes for first die 104 and second die 106. In addition, substrate 108 populated with surface mount devices 110 may be pre-fabricated at a site other than the site that assembles SIP 100. The independent integration process makes it easier to change the design of substrate 108 with surface mount devices 110.

Wirebonds 112 may be any suitable wirebonds, such as gold wirebonds that couple respective components of SIP 100. For example, wirebonds 112 may couple substrate 108 to each of substrate 102, first die 104, and second die 106. In addition, both first die 104 and second die 106 may both couple to substrate 102 with suitable wirebonds. Any suitable interconnection between components of SIP 100 is contemplated by the present invention.

Mold compound 114 may be any suitable mold compound that functions to encapsulate first die 104, second die 106, substrate 108, surface mount devices 110, and wire bonds 112. For example, mold compound 114 may be a suitable epoxy, thermosetting plastic, or thermoplastic. Mold compound 114 may be formed with any suitable thickness and in any suitable configuration.

FIGS. 2A through 2E illustrate various manufacturing stages of SIP 100 according to one embodiment of the invention. Referring first to FIG. 2A, first die 104 is coupled to top surface 103 of substrate 102 in any suitable manner, such as by a suitable epoxy. Optionally, at this point in the manufacturing sequence, first die 104 may be electrically coupled to one or more bond pads 118 of first substrate 102 with suitable wirebonds 112 (not illustrated in FIG. 2A). In addition, although not illustrated in FIG. 2A, depending on the type of material used to couple first die 104 to substrate 102, a curing step may also take place at this point in the manufacturing sequence.

As illustrated in FIG. 2B, second die 106 is then coupled to top surface 105 of first die 104 in any suitable manner, such as with a film adhesive. Optionally, at this stage of the manufacturing sequence, second die 106 may be electrically coupled to one or more bond pads 118 of first substrate 102 and/or suitable bond pads on first die 104 with suitable wirebonds 112 (not explicitly illustrated in FIG. 2B). In addition, first die 104 may be electrically coupled to one or more bond pads 118 of first substrate 102 if this was not performed previously. An optional curing step may also take place at this point in the manufacturing sequence. Although not illustrated in the figures, subsequent dies may be stacked upon one another. Again, any suitable number of stacked integrated circuit die are contemplated by the present invention.

FIG. 2C illustrates substrate 108 coupled to top surface 107 of second die 106 in any suitable manner, such as with a film adhesive. In one embodiment, surface mount devices 110 are coupled to top surface 109 of substrate 108 before substrate 108 is coupled to top surface 107 of second die 106. In other words, surface mount devices 110 may be coupled to top surface 109 of second substrate 108 in parallel with the manufacturing/packaging of first die 104 and second die 106 in order to make the manufacturing of SIP 100 more efficient. Optionally, at this stage of the manufacturing sequence, second substrate 108 may be electrically coupled to one or more bond pads 118 of first substrate 102 and/or suitable bond pads on either or both of first die 104 and second die 106 with suitable wirebonds 112 (not explicitly illustrated in FIG. 2C). In addition, first die 104 and/or second die 106 may be electrically coupled to one or more bond pads 118 of first substrate 102 (or to each other) if this was not performed previously. An optional curing step may also take place at this point in the manufacturing sequence.

Referring to FIG. 2D, wirebonds 112 are shown to be interconnecting first substrate 102, first die 104, second die 106, and substrate 108. As described above, any suitable interconnection between these components are contemplated by the present invention.

After the wirebonding process is completed, the encapsulating of the components of SIP 100, as shown in FIG. 2E, is performed. As described above, any suitable mold compound 114 may be utilized. In addition, after the encapsulation of the components, a suitable curing step may take place. Solder balls 122 may then be coupled to the bottom surface of substrate 102 to complete SIP package 100 in the form of a ball grid array ("BGA") package. In lieu of a BGA package, SIP 100 may also take the form of a pin grid array, a lead frame package, or other suitable integrated circuit package. Subsequent steps may include marking and testing of SIP 100. In addition, the present invention contemplates SIP 100 being formed integrally with many other SIPs before a suitable singulation process separates them into individual packages.

Thus, SIP 100 facilitates a vertically integrated surface mount device populated substrate into a suitable integrated circuit package. Surface mount devices 110 are vertically stacked along with the stacked integrated circuit die, which helps to reduce the footprint of SIP 100 in some embodiments.

Although embodiments of the invention and their advantages are described in detail, a person skilled in the art could make various alterations, additions, and omissions without departing from the spirit and scope of the present invention, as defined by the appended claims.

What is claimed is:

1. A system-in-a-package, comprising:
    a first substrate having a top surface;
    a first die coupled to the top surface of the first substrate;
    one or more passive surface mount devices coupled to a top surface of a second substrate; and
    a second die having a top surface coupled to the second substrate and an opposite surface coupled to a top surface of the first die;
    wherein the first and second substrates, the first and second die are directly electrically coupled together with a plurality of wirebonds; and
    the first and second die, the second substrate and the surface mount devices are encapsulated with a mold compound.

2. The system-in-a-package of claim 1, wherein each of the passive surface mount devices is selected from the group consisting of a capacitor, a diode, a resistor and an inductor.

3. The system-in-a-package of claim 1, wherein the first substrate is a printed circuit board having a plurality of bond pads coupled to a perimeter thereof that generally surround the first die.

4. The system-in-a-package of claim 1, further comprising a plurality of solder balls coupled to a bottom surface of the first substrate.

5. The system-in-package of claim 1 wherein the second die is a plurality of stacked die having a top surface coupled to the second substrate and an opposite surface coupled to the top surface of the first die.

\* \* \* \* \*